United States Patent [19]

Savoye et al.

[11] Patent Number: 4,658,497
[45] Date of Patent: Apr. 21, 1987

[54] METHOD OF MAKING AN IMAGING ARRAY HAVING A HIGHER SENSITIVITY

[75] Inventors: Eugene D. Savoye, Lancaster, Pa.; Walter F. Kosonocky, Skillman, N.J.; Lloyd F. Wallace, Coatesville, Pa.

[73] Assignee: RCA Corporation, Princeton, N.J.

[21] Appl. No.: 740,719

[22] Filed: Jun. 3, 1985

Related U.S. Application Data

[62] Division of Ser. No. 455,332, Jan. 3, 1983, abandoned.

[51] Int. Cl.[4] ............................................. H01L 21/26
[52] U.S. Cl. ..................... 29/572; 29/576 B; 29/576 W; 29/571; 148/1.5; 148/171; 148/DIG. 83
[58] Field of Search ............. 29/572, 576 B, 576 W, 29/576 C; 148/1.5, 171, DIG. 83; 357/48, 52

[56] References Cited

U.S. PATENT DOCUMENTS

| | | | |
|---|---|---|---|
| 3,386,865 | 6/1968 | Doo | 29/576 W |
| 3,863,065 | 1/1975 | Kosonocky et al. | 250/211 J |
| 3,866,067 | 2/1975 | Amelio | 307/311 |
| 3,896,485 | 7/1975 | Early | 357/24 |
| 3,961,999 | 6/1976 | Antipov | 29/576 W |
| 4,028,716 | 6/1977 | van Santen et al. | 357/24 |
| 4,173,064 | 11/1979 | Farnow | 29/578 |
| 4,232,245 | 11/1980 | Savoye et al. | 313/367 |
| 4,362,575 | 12/1982 | Wallace | 148/1.5 |
| 4,396,438 | 8/1983 | Goodman | 148/1.5 |
| 4,435,897 | 3/1984 | Kuroda et al. | 29/572 |

FOREIGN PATENT DOCUMENTS

| | | | |
|---|---|---|---|
| 61177 | 5/1981 | Japan | 29/572 |
| 7766 | 1/1985 | Japan | 29/572 |
| 2087152A | 5/1982 | United Kingdom | |

Primary Examiner—Brian E. Hearn
Assistant Examiner—John T. Callahan
Attorney, Agent, or Firm—Birgit E. Morris; Donald S. Cohen; William J. Burke

[57] ABSTRACT

An imaging array of the charge transfer type having improved sensitivity is disclosed. The array includes a plurality of substantially parallel charge transfer channels with channel stops therebetween which extend a distance into a semiconductor body. At least some of the channel stops have blooming drains therein for the removal of excess photogenerated charge. The improvement comprises potential barrier means which constrain electrical charge generated by absorption of light in the body to flow into the channels while preventing the loss of such charge by direct flow to the blooming drains. Potential barrier means include buried barrier regions extending a further distance into the body from those channel stops having blooming drain regions therein.

The invention also includes an improved method of forming this array wherein the improvement comprises forming buried barrier regions containing a greater concentration of conductivity modifiers than the channel stops after the blooming drains are formed.

6 Claims, 3 Drawing Figures

METHOD OF MAKING AN IMAGING ARRAY HAVING A HIGHER SENSITIVITY

This is a division of application Ser. No. 455,332, filed Jan. 3, 1983 now abandoned.

This invention relates to an imaging array of the charge transfer type exhibiting increased sensitivity to light and a method of making the array.

BACKGROUND OF THE INVENTION

Imaging arrays of the charge transfer type, such as the charge coupled device disclosed by Wallace in U.S. patent application Ser. No. 297,055 filed Aug. 27, 1981, now U.S. Pat. No. 4,362,575, issued Dec. 7, 1982 which is incorporated herein by reference, store light-generated electrical charge and transfer such charge to a charge detector for detection and display. The array generally includes a semiconductor body of a first conductivity type having a plurality of substantially parallel charge transfer channels of opposite conductivity type extending a distance into the body from a first major surface thereof. The charge transfer channels are isolated from one another by channel stops which provide potential barriers to the flow of stored charge between adjacent channels. Each channel stop is generally composed of a region which extends a distance into the body from the first major surface between a pair of charge transfer channels which has the same conductivity type as the body but has a higher concentration of conductivity modifiers. A dielectric insulator overlies the first major surface with a plurality of substantially parallel electrodes overlying the dielectric layer and extending in a direction transverse to the direction of the charge transfer channels.

Application of a voltage of the proper polarity to a particular electrode will cause light-generated electrical charge to accummulate in a potential well in the charge transfer channel under the electrode. The sequential application of voltages to successive electrodes over a channel will cause the charge to be transferred to the charge detector.

If the amount of charge generated in a particular portion of the array is in excess of the amount which can be stored in the potential well formed under a particular electrode, the excess charge will spread into adjacent potential wells along the charge transfer channel. This spreading of the charge causes an increase in the size of the brightest portions of an image and is known as blooming. A solution to the blooming problem is to reduce the concentration of conductivity modifiers in the channel stops and to form blooming drains in the channel stops which have the opposite conductivity type to that of the semiconductor body. The lighter doping of the channel stops reduces the height of the potential barrier between the potential wells in the channels and the blooming drains so that the excess charge preferentially flows over the barrier and into the blooming drain rather than over the higher barriers along the charge transfer channel. The drains signficantly reduce the blooming but at the price of also reducing the light sensitivity of the array since a portion of the charge generated in the semiconductor body, rather than flowing to the potential wells in the channels, flows directly into the drains and is lost. Thus it would be desirable to have an imaging array having blooming control but without the corresponding loss of sensitivity.

SUMMARY OF THE INVENTION

The invention is an imaging array of the charge transfer type having high sensitivity to incident light where the improvement comprises potential barrier means for preventing the direct flow of photogenerated charge into a blooming drain. The potential barrier means typically comprises buried barrier regions of the same conductivity type as the semiconductor body, but containing a greater concentration of the same type conductivity type modifier, and which extend a further distance into the body from those channel stops having a blooming drain therein. The concentration of conductivity modifiers is sufficient to form a potential barrier to the direct flow of charge generated in the bulk of the semiconductor body to the blooming drains thereby increasing the quantum efficiency of the array.

The invention also includes a method of forming an array having a higher quantum efficiency wherein the improvement comprises forming buried barrier regions containing a greater concentration of the same conductivity modifier as that contained in the body and extending a further distance in the semiconductor body under the blooming drains.

DETAILED DESCRIPTION OF PREFERRED EMBODIMENTS

Figure 1:
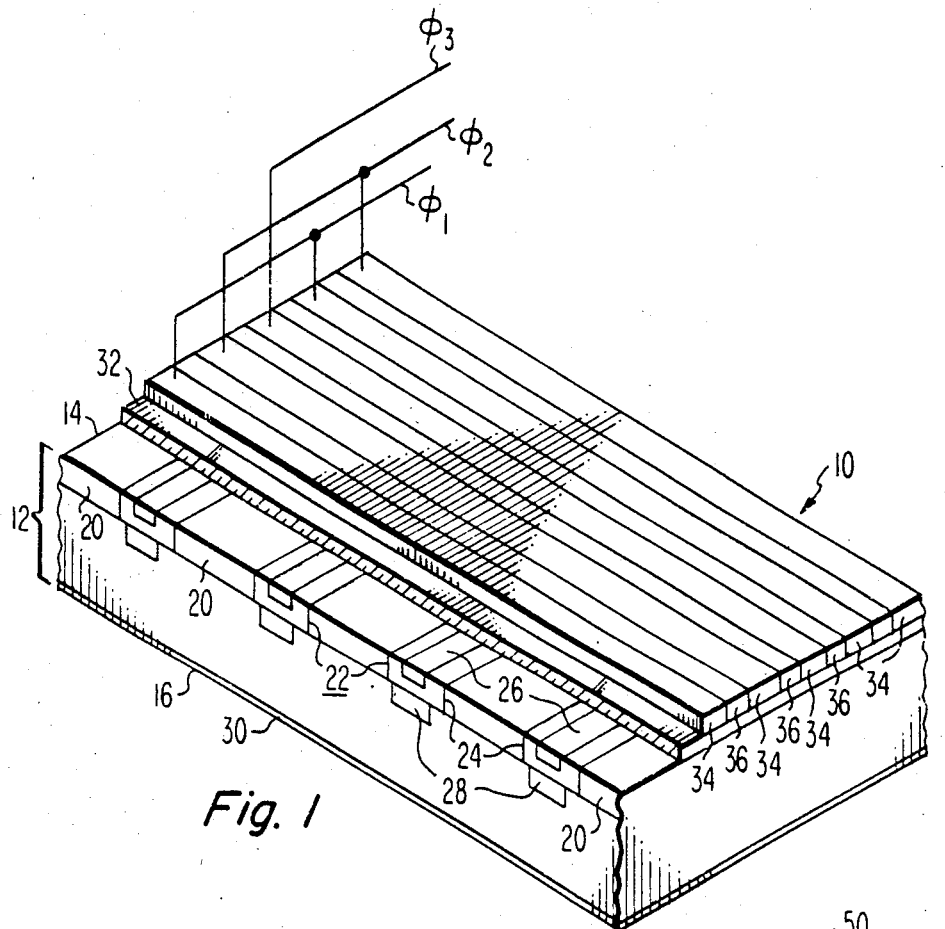
FIG. 1 is a perspective cutaway view of a portion of an imaging array of the invention.

In FIG. 1 a portion of an imaging array 10 of the charge coupled type is shown. The array 10 includes a semiconductor body 12 having first and second major surfaces 14 and 16 respectively. The semiconductor body 12 is composed of a semiconductor material such as silicon having a first conductivity type. A plurality of substantially parallel charge transfer channels 20 of the opposite conductivity type extend a distance into the body 12 from the first major surface 14. Channel stops 22 extend a distance into the body 12 from the surface 14 between the charge transfer channels 20. The channel stops 22 comprise channel barrier regions 24, each having a blooming drain 26 extending a distance from the major surface 14. The channel barrier regions 24 contain a greater concentration of first conductivity type modifiers than the body 12 and have a slight excess net concentration of either first or second conductivity type modifiers. The blooming drains 26 contain a considerably greater concentration of second type conductivity modifiers than do the channels 20. Buried barrier regions 28 extend a further distance into the body 12 below the blooming drains 26 and contain a greater concentration of first conductivity type modifiers than do either the body 12 or the channel barrier regions 24. A backside surface barrier region 30 extends a distance into the second major surface 16 and contains a much greater concentration of first type conductivity modifiers than does the body 12 and is typically less than 100 nanometers (nm) thick.

An electrically insulating layer 32, typically a thermally grown silicon dioxide (channel oxide), overlies the first major surface 14 of the body 12. A plurality of channel electrodes 34, which are substantially perpendicular to the charge transfer channels 20, overlie the electrically insulating layer 32. The channel electrodes 34 are spaced apart from one another by interelectrode insulators 36.

In FIG. 1 a three phase arrangement for the charge transfer is shown in which every third channel electrode 34 is connected to the same voltage signal. It is to be understood that the invention is also applicable to any other arrangement for the transfer of photogenerated charge, such as a two phase transfer system, which includes a blooming drain to control excess charge.

We have discovered that the flow of photogenerated electrical charge directly to the blooming drains 28 causes a significant reduction in the amount of charge flowing into the potential wells in the charge transfer channels 20, thereby reducing the quantum efficiency of the light sensing array. The buried barrier regions 28 form a potential barrier to the flow of photogenerated charge directly into the blooming drains, thereby constraining such charge to flow into the channels 20 from whence it can be detected. The presence of the buried barrier regions 28 results in a factor of about two improvement in the quantum efficiency. The presence of the buried barrier regions 28 does not prevent the flow of excess charge from a channel 20 into a blooming drain 26 and therefore blooming control is preserved.

In the remaining Figures the identification of elements common to those Figures and to FIG. 1 is the same.

Figure 2:
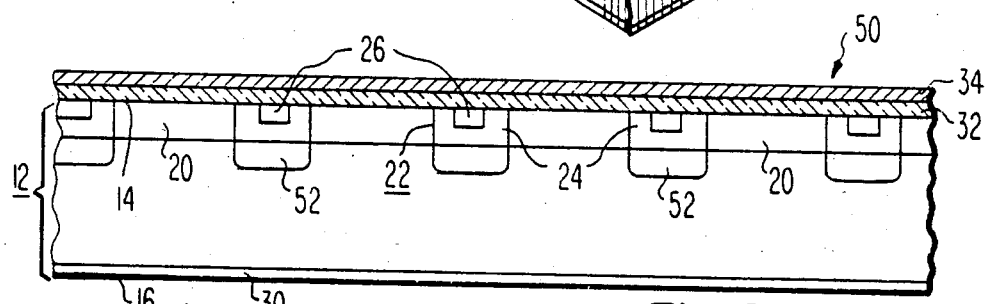
FIGS. 2 and 3 are cross-sectional views of portions of two different embodiments of the imaging array of the invention.

In FIG. 2 the light sensing array 50 differs from the light sensing array of FIG. 1 in that the buried barrier regions 52 extend a further distance into the body from the channel stop 22 over the full width of the channel stop 22.

Figure 3:
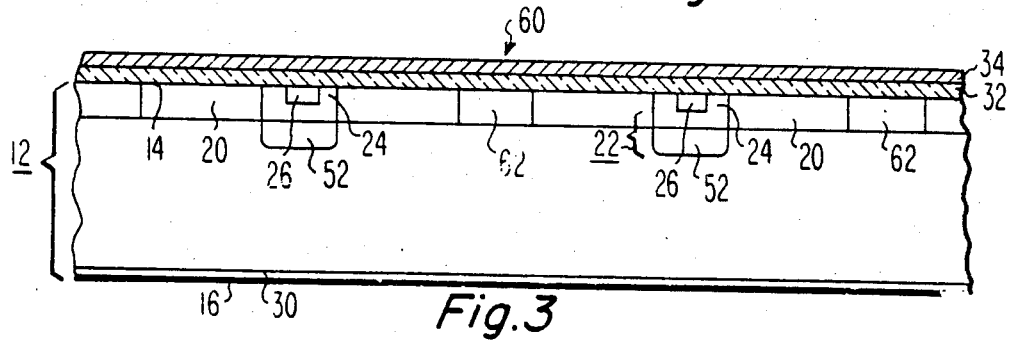

In a light sensing array without buried barrier regions 28, it is desirable that blooming drains 26 be positioned in the channel stops 22 on either side of a charge transfer channel so that the loss of charge by direct flow to the blooming drains is symmetrical. Since the presence of a buried barrier region adjacent to a blooming drain prevents this loss of charge, the need for symmetrical blooming drains about a channel is eliminated. Thus, adjacent channels can share a common blooming drain with the blooming drain in the alternate channels being eliminated. This should result in an increase in the manufacturing yield of useable devices since roughly one-half of the blooming drains are eliminated. This principle is illustrated in FIG. 3 where the light sensing array 60 differs from the light sensing array 50 of FIG. 2 in that alternate ones of the channel stops 22 are replaced by channel stops 62 which consists of only the channel barrier regions 24 of the channel stops 22. The channel stops 62 are regions extending a distance into the body 12 from the first major surface between charge transfer channels and which contain a greater concentration of first conductivity type modifiers than the body 12, and contain a slight excess concentration of either conductivity type modifiers. Only those channel stops 22 having blooming drains 26 therein require the presence of a buried barrier region 52.

The substrate typically has p-type conductivity and contains an excess concentration of p-type conductivity modifiers of between about 1.0 and $15 \times 10^{14}/cm^3$, corresponding respectively to a bulk resistivity between about 150 and $10\Omega/cm$. The channels have n-type conductivity and contain an excess concentration of n-type conductivity modifiers between about 1 and $10 \times 10^{16}/cm^3$. The blooming drains have n-type conductivity and typically contain an excess concentration of n-type conductivity modifiers between about $10^{18}$ and $10^{21}/cm^3$. The channel barriers typically contain between about 1 and $5 \times 10^{16}/cm^3$ p-type conductivity modifiers. The channel barriers also typically contain n-type conductivity modifiers in about the same concentration as the channels since the n-type implant or diffusion used to form the channels is done uniformly over the area of the channels and channel stops. This results in a lightly n-type conducting portion of the channel barrier regions adjacent to the major surface of the body. The concentration of conductivity modifiers in the channel barrier regions should be such that the magnitude of the potential barrier between the channel and the blooming drain causes excess charge preferentially to flow into the blooming drain rather than along the channel.

The buried barrier regions typically contain between about five and five hundred times greater, and preferably about one hundred times greater, concentration of p-type conductivity modifiers than the body 12. Preferably, the concentration of p-type conductivity modifiers is greater than $2.5 \times 10^{17}/cm^3$. The concentration of conductivity modifiers in the buried barrier regions must be sufficient to provide a barrier to charge flow directly from the body to the blooming drains. The concentration must also be great enough to prevent the depletion region generated by application of a bias voltage to the blooming drains from reaching through the buried barrier region to the body.

The imaging arrays of the invention may be fabricated using the self-aligned techniques disclosed by Wallace in U.S. Pat. No. 4,362,575 referred to above. A thermal oxide about 500 nanometers (nm) thick is grown on a p-type silicon substrate having a resistivity between about 10 and $150\Omega/cm$. The thermal oxide is covered with a layer of photoresist and the blooming drain pattern is defined therein. The photoresist and the thermal oxide are then removed in the defined areas and the silicon is doped through the openings in the oxide by ion implantation of arsenic to a dose of $3.6 \times 10^{14}/cm^2$ at a beam energy of 200 keV to form the blooming drains. The silicon body is then subjected to a "deep" boron implant to a dose of $7 \times 10^{12}/cm^2$ at 400 keV to form the buried barrier regions. The openings in the oxide are then enlarged by etching back the oxide under the photoresist by about 3 micrometers ($\mu m$) to each side of the original opening. The photoresist is then removed and a "shallow" boron implant to a dose of $7 \times 10^{11}/cm^2$ at 100 keV is carried out. At this point in the process the p-type semiconductor body contains the heavily doped n-type blooming drains extending a distance into the body of about 150 nm and surrounded by a moderately doped p-type region extending about 330 nm into the body from the surface and about 3 $\mu m$ laterally along the surface from the n-type blooming drains. The buried barrier regions formed by a "deep" boron implant extend a further distance of about 1000 nm into the body from the moderately doped p-type channel stop regions and contain about a factor of ten greater concentration of acceptors than does the moderately doped channel barrier regions.

After the arsenic and boron implants are completed, the thermal oxide is stripped from the surface, a capping oxide is formed over the entire surface and phosphorus is implanted to a dose of $2.0 \times 10^{12}/cm^2$ at 175 keV in the area of the charge transfer channels and channel stops to form the channels. This implant, since the phosphorus is also implanted into the regions of the channel stops, compensates this region leaving it lightly p- or n-type conducting.

After this step is completed additional processing steps well known in the art are carried out to fabricate the remainder of the array including the electrically insulating layer and the channel electrodes.

The array of FIG. 2 is fabricated by performing the "deep" boron implant after the openings in the oxide layer are enlarged and either before, after or simultaneous with the "shallow" boron implant. The array of FIG. 3 may be fabricated by forming the channel stops 62 after the arsenic and "deep" boron implants have been completed.

While the fabrication process has been described in terms of particular conductivity type modifers, it is to be understood that other elements which have the same effect may be used. It is also to be understood that the conductivity types of the different regions may be reversed so long as the relationship in the conductivity types of the body and the different regions is maintained.

We claim:

1. In a method of fabricating an imaging array in a semiconductor body of first conductivity type which has a major surface, which method includes the steps of forming spaced apart blooming drains extending a distance into the major surface and comprising regions of a second conductivity type, forming channel stops around the blooming drains which comprise regions containing an excess concentration of first type conductivity modifiers, forming charge transfer channels extending a distance into the body from the major surface which comprise regions of a second conductivity type whereby there is at least one channel stop with a blooming drain therein adjacent to each channel;

the improvement which comprises forming directly under each blooming drain a buried barrier region containing a greater concentration of first type conductivity modifiers than the semiconductor body and the channel stop and extending a further distance into the body from the channel stop containing the blooming drain.

2. The method of claim 1 wherein the step of forming the buried barrier regions is performed after the step of forming the channel stops.

3. The method of claim 1 wherein the step of forming the buried barrier regions is performed simultaneously with the step of forming the channel stops.

4. The method of claim 1 wherein the step of forming the channel stops and the buried barrier regions is performed by ion implantation of the same type of conductivity modifier.

5. The method of claim 4 wherein the number of first conductivity modifiers implanted to form the buried barrier regions below the channel stops is between about five and five hundred times the bulk concentration of first conductivity type modifiers in the body.

6. The method of claim 1 wherein the buried barrier regions are formed after the step of forming the blooming drains.

* * * * *